United States Patent [19]

Dupuis et al.

[11] 4,044,300

[45] Aug. 23, 1977

[54] METHOD FOR CHECKING A STORAGE BATTERY

[75] Inventors: Jean-Michel Dupuis, Gennevilliers; Pierre Lasserre, Nanterre, both of France

[73] Assignee: Compagnie Europeenne d'Accumulateurs, Paris, France

[21] Appl. No.: 699,401

[22] Filed: June 24, 1976

[30] Foreign Application Priority Data

June 24, 1975 France ................ 75.19747

[51] Int. Cl.² .................................... G01N 27/42
[52] U.S. Cl. ............................ 324/29.5; 320/48
[58] Field of Search ............... 320/48, 15, 18, 31; 324/29.5, 30 R

[56] References Cited

U.S. PATENT DOCUMENTS

| 2,101,571 | 12/1937 | Breisch | 324/29.5 |
| 3,586,962 | 6/1971 | Rebstock | 324/29.5 |
| 3,808,487 | 4/1974 | Feuillade | 324/29.5 |

*Primary Examiner*—Rudolph V. Rolinec
*Assistant Examiner*—Michael J. Tokar

*Attorney, Agent, or Firm*—Sughrue, Rothwell, Mion, Zinn and Macpeak

[57] ABSTRACT

A method of checking a storage battery with series-connected cells comprises the steps of:

passing a charging current pulse through the battery, measuring an elementary transient voltage at the terminals of each storage cell; and comparing elementary transient voltages with the average transient voltage of the said storage cells (total transient voltage divided by the number of storage cells).

The battery is rejected if the absolute value of the difference between the said average transient voltage and one of the elementary transient voltages, when the difference maintains a constant sign, becomes higher than a predetermined threshold and, when the difference changes signs, if the sum of the maximum absolute values of the differences in constant sign becomes higher than a predetermined threshold. Application: checking lead-acid storage batteries when they come off the production line.

8 Claims, 6 Drawing Figures

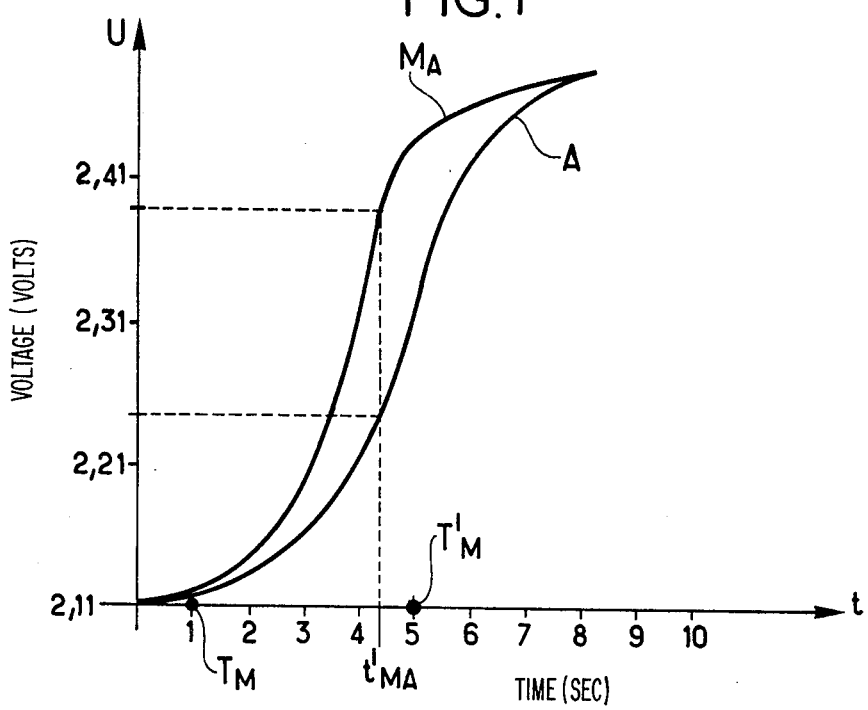
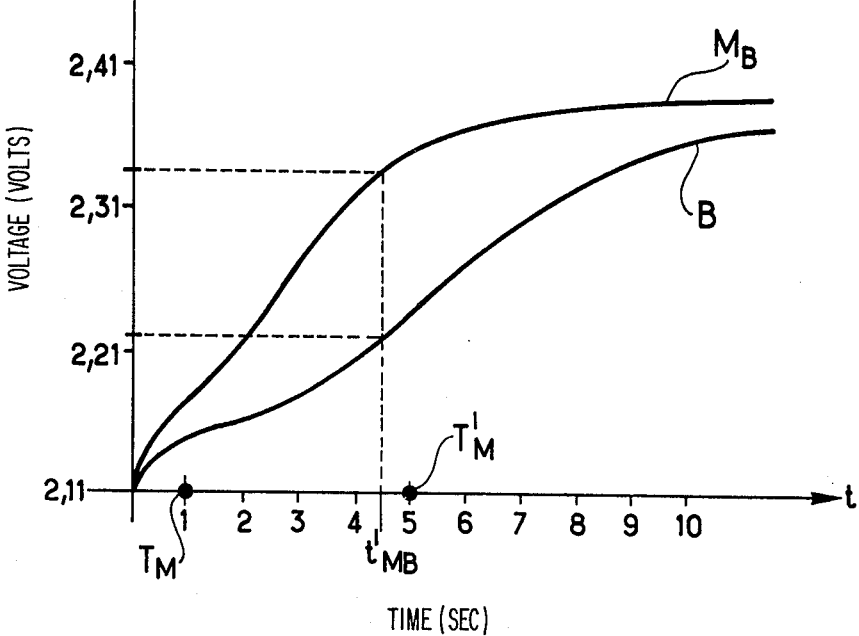

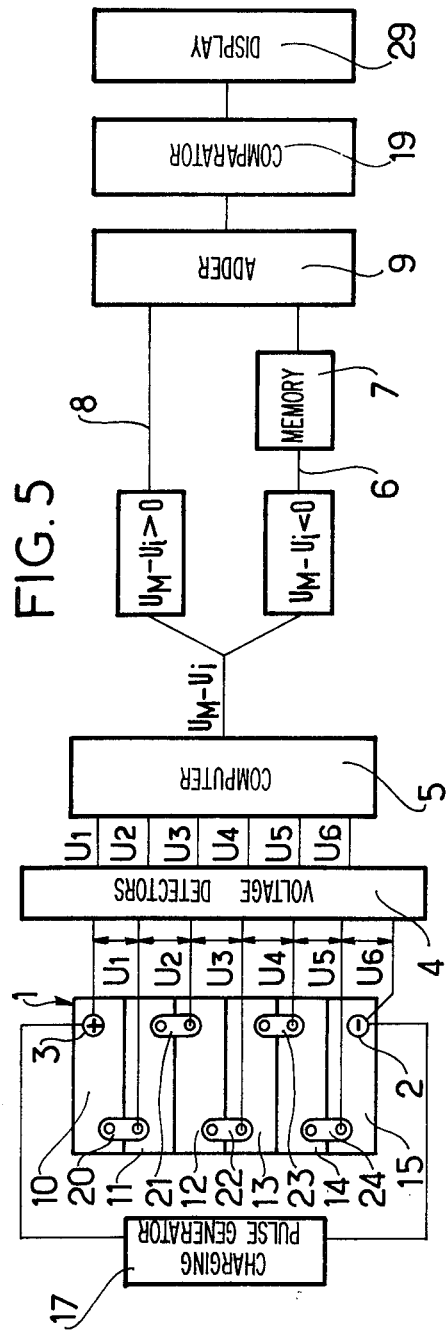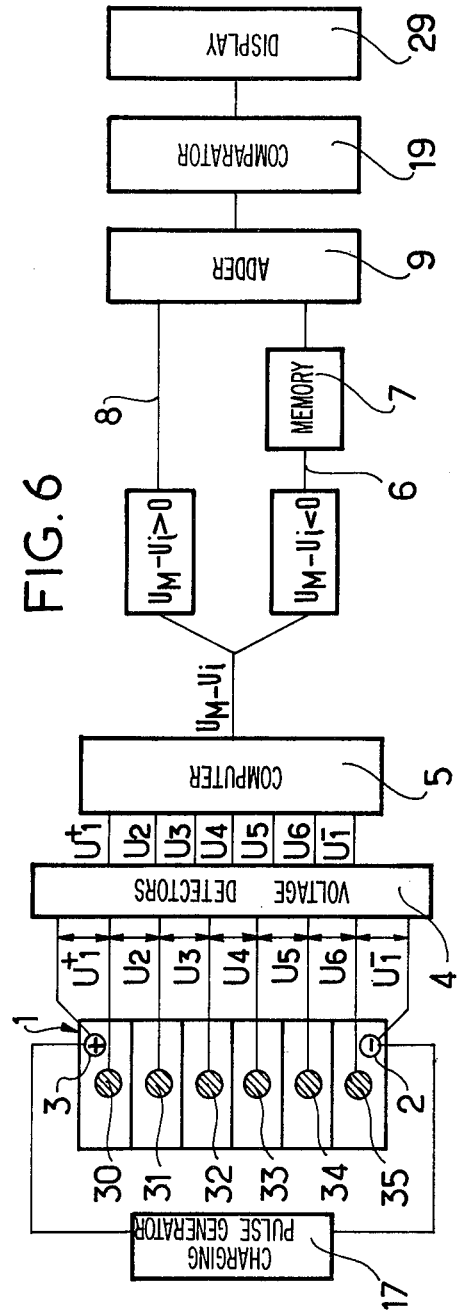

METHOD FOR CHECKING A STORAGE BATTERY

BACKGROUND OF THE INVENTION

1. Field of the Invention

A method and a device for checking a storage battery, more particularly a leadacid storage battery, charged and filled with electrolyte, this checking being effected when the battery comes off the production line.

2. Description of the Prior Art

Known means which are used at present for detecting electrical defects which have not been detected during checks made at intermediate stages of production are of two types:

Firstly, devices for measuring the voltage of the batteries at the end of the forming and charging phase enabling the rejection of batteries whose end-of-charge voltage is lower than a predetermined threshold; and Secondly, rapid discharge devices requiring the rejection of batteries whose voltage is insufficient after a few seconds of discharge.

These means are generally completely insufficient for detecting small or medium internal short circuits and even large short circuits, which can be detected by conventional checking methods only after long storage or service periods. Moreover, they are not suitable for detecting properly, in a battery, the reverse installation and forming of cells or defects such as twisted plates, lack of electrolyte, or defective separators.

The present invention proposes a checking method and device enabling the above-mentioned defects to be detected a short time after the end of the forming and charging phase, i.e., in practice, during battery finishing operations.

SUMMARY OF THE INVENTION

The present invention provides a method of checking a storage battery with series connected cells comprising the following steps:
- passing a charging current pulse through the battery;
- measuring an elementary transient voltage at the terminals of each storage cell; and
- comparing elementary transient voltages with the average transient voltage of the said storage cells (total transient voltage divided by the number of storage cells);
- whereby, battery is rejected if the absolute value of the difference between the average transient voltage and one of the elementary transient voltages, when the difference maintains a constant sign, becomes higher than a predetermined threshold and, when the difference changes sign, if the sum of the maximum absolute values of the differences in constant sign becomes higher than a predetermined threshold.

In the method according to the invention, the transient voltage of a storage cell to be tested is compared, not with that of a standard storage cell, but with the average transient voltage of all the cells of the battery to which it belongs; thus, in each battery, the average theoretical cell is assimilated to a normal reference cell.

The existence of an electric defect in a storage cell results in a difference in transient voltage which is greater in proportion to the magnitude of the defect. The threshold value is chosen as a function of the least defect which it is necessary to detect.

The said measurement of transient voltages can be effected continuously or at predetermined instants, punctually a first instant at the beginning of the charge current pulse, after approximately one second, and a second instant in substantially the middle part of the said pulse. In this case, the signs of the differences between the average transient voltage and the elementary transient voltage resulting from the first and from the second measurement are examined if:
- The differences are positive, the battery current is rejected if the difference resulting from the second measurement is higher than a predetermined threshold;
- The differences are negative, the battery is rejected if the absolute value of the difference resulting from the first measurement is higher than a predetermined threshold;
- The differences have opposite signs, the battery is rejected if the sum of the absolute values of the said differences is higher than a predetermined threshold.

The charge current pulse can be a square wave pulse whose intensity is a few amperes and which last a few seconds;

The pulse can alternatively have an intensity which increases proportional to time (a few amperes per second, for example) and can last for a time on the order of a few seconds.

The invention also provides a device enabling the implementation of the preceding method.

Embodiments of the invention are described by way of example with reference to the accompanying drawings.

BRIEF DESCRIPTION OF THE DRAWINGS

FIG. 1 is a graph showing transient voltage curves U (volts) as a function of time $t$ (seconds) of a defective storage cell and of the average storage cell subjected to a charge current pulse whose intensity is proportional to time (one ampere per second);

FIGS. 2, 3, 4 are graphs showing transient voltage curves U (volts) as a function of time (seconds) of a defective storage cell and of the average storage cell subjected to a charge pulse having a constant intensity of 5 amperes, according to three types of response due to the existence of defects;

FIG. 5 is a schematic block diagram of a device for implementing the method according to the invention applied to a battery in which the cells have electric connections which are externally accessible; and FIG. 6 is a schematic block diagram of an analogous device to the one of FIG. 5, but suitable for checking batteries whose electric connections are not externally accessible.

DESCRIPTION OF THE PREFERRED EMBODIMENTS

The examples described below concern 12-volt leadacid batteries, containing 6 2-volt cells connected in series and having a capacity of 40 Ah in 20 hours. These batteries have been checked as they came off the production line.

FIG. 1 shows curves A and MA which are representative of the variations as a function of time of transient voltages $U_A$ and $U_{MA}$ respectively of a defective cell and of an average cell subjected to a charging pulse which increases at one ampere per second during 10 seconds. The comparison between $U_A$ and $U_{MA}$, according to the method of the invention, shows a difference $U_{MA}-U_A$ of constant sign, which is positive here; the battery is therefore rejected if the absolute value of this difference becomes higher than a predetermined threshold.

A first point measurement can be effected near the beginning of the charging current pulse at an instant $T_M = 1s$ and a second measurement in substantially the middle part of the said pulse at an instant $T'_M = 5s$ (the values shown being given by way of example). The signs of the differences between the average transient voltage and the elementary transient voltage resulting from the two measurements are examined: here, the differences are positive; therefore, the battery is rejected if the difference resulting from the second measurement (at $T'_M$) should be higher than a predetermined threshold. The value $T'_M$ is very close to the true value $t'_{MA}$ of the maximum deviation between the two curves and the requirement for two point measurements is satisfactory for selecting batteries having a defective cell giving this type of response.

FIG. 2 shows curves B and MB which are representative of the variations as a function of time of the transient voltages $U_B$ and $U_{MB}$ respectively of a defective cell and of the average cell subjected to a charging current pulse of 5 amperes during 10 seconds. The comparison between $U_B$ and $U_{MB}$ detects a difference $U_{MB} - U_B$ having a constant sign, which is positive here; the battery is therefore rejected if the absolute value of this difference becomes higher than a predetermined threshold.

In the case of a point measurement at the instants $T_M$ and $T'_M$, the two differences obtained being positive, the possible rejection of the battery is controlled by the difference resulting from the second measurement, as in FIG. 1.

Figure 3:
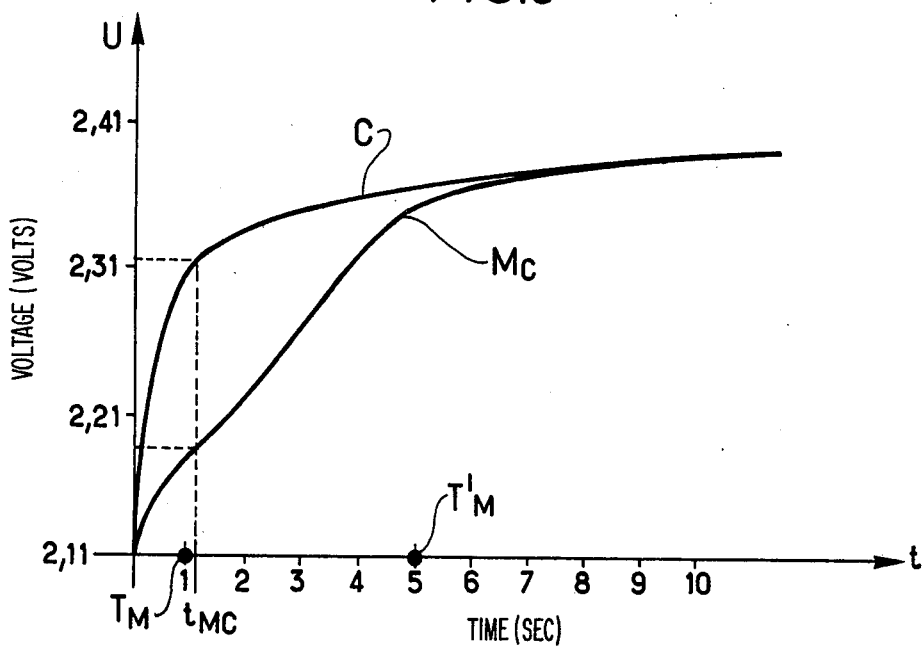

FIG. 3 shows curves C and MC representative of the variations as a function of time of the transient voltages $U_C$ and $U_{MC}$ respectively of a defective cell and of the average cell subjected to a square wave pulse of 5 amperes during 10 seconds. The comparison between $U_C$ and $U_{MC}$ indicates a difference $U_{MC} - U_C$ having a constant sign, which is negative here; therefore the battery is rejected if the absolute value of this difference becomes higher than a predetermined threshold.

In the case of a point measurement at the instants $T_M$ and $T'_M$, the two differences obtained being negative, the battery is rejected if the absolute value of the difference resulting from the first measurement is higher than a predetermined threshold.

Figure 4:
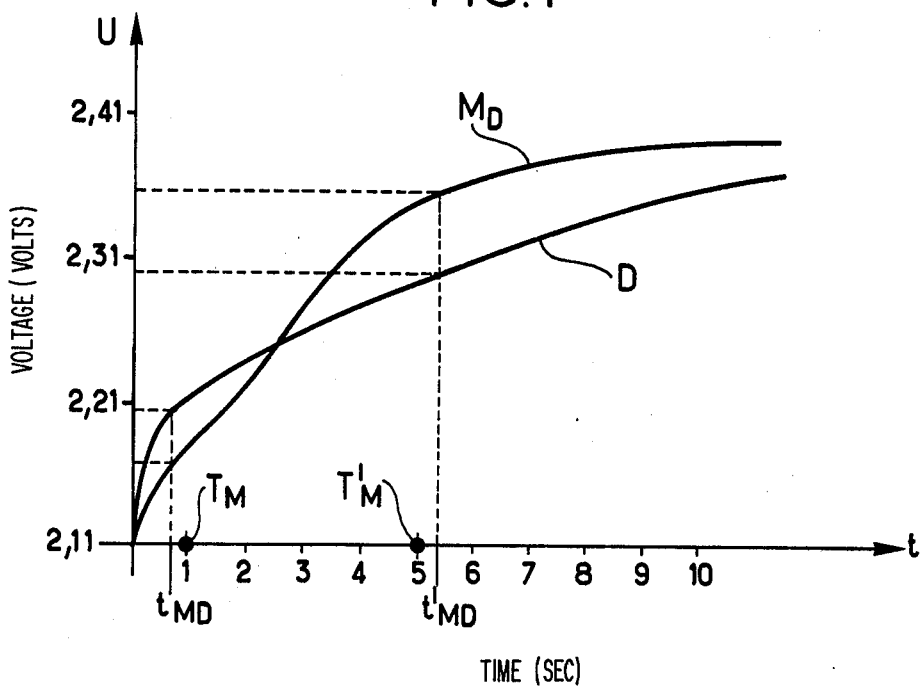

FIG. 4 shows curves D and MD which are representative of the variations as a function of time of the transient voltages $U_D$ and $U_{MD}$ respectively of a defective cell and the average cell subjected to a square wave pulse of 5 amperes during 10 seconds. The comparison between $U_D$ and $U_{MD}$ detects a difference $U_{MD} - U_D$ which changes sign, negative then positive here; the battery is therefore rejected if the sum of the absolute maximum values of the differences (i.e. regardless of their signs) is higher than a predetermined threshold.

In the case of a point measurement at the instants $T_M$ and $T'_M$, the two differences obtained having opposite signs, the battery is rejected if the sum of the absolute values of the said differences is higher than a predetermined threshold.

As in FIG. 1, the values of at least one of $T_M$ and $T'_M$ in FIGS. 2, 3 and 4 are very close to their respective true values $t_{MC}$, $t_{MD}$ and $t'_{MB}$, $t'_{MD}$ each corresponding to an extreme of the deviation between the two curves.

Thus the requirement for two point measurements remains satisfactory for selecting the batteries having a defective cell giving one of these three types of response.

To implement the method according to the invention practically, the transient voltage of a cell to be tested is compared, not with that of a standard cell, but with the average transient voltage of all the cells of the battery to which the cell belongs. For this purpose, the device to be used is shown schematically in FIG. 5 and is intended for checking a battery 1 of storage cells 10 to 15 whose intermediate electrical connections 20 to 24 are accessible from the outside. A charging pulse generator 17 is connected to the terminals 2 and 3 of the battery 1. Voltage detectors represented by a block 4 are connected between the terminals of the cells and send signals U1 to U6 to a computer 5. The computer 5 determines the average transient voltage $$U_M = \frac{U_1 + \ldots U_6}{6},$$

and addresses signals which are significant of the deviations $U_M - U_i$ ($i$ varying from 1 to 6) towards one of the two outputs 6 and 8, according to the sign of the differences $U_M - U_i$.

A first output 6 operates only if the difference $U_M - U_i$ is negative and comprises a memory 7 enabling the maximum absolute value of $U_M - U_i$ to be recorded; when the difference $U_M - U_i$ is positive, the data passes through the output 8. The voltages supplied by the memory 7 and the output 8 are, when they are not zero voltages, added in the block 9 then this sum is compared with a threshold $U_O$ in a comparator 19 which sends out an output signal if this sum is higher than the threshold chosen. A display element 29 is connected to the output of the comparator 19.

In order better to understand the operation of the device in FIGS. 5, the curves in FIGS. 1 to 4 must be referred to again:

In FIG. 1 and 2, the difference $U_M - U_i$ always remains positive; consequently, the data leaves the computer 5 through the output 8 and the comparator 19 sends out an output signal if $U_M - U_i$ becomes greater than $U_O$;

In the case of FIG. 3, the difference $U_M - U_i$ remains constantly negative; consequently, the data leaves the computer 5 through the output 6; the memory 7 then records the maximum absolute value of $U_M - U_i$ and the comparator 19 sends out an output signal when the absolute value of this difference becomes higher than a predetermined threshold;

In FIG. 4, the difference $U_M - U_i$ is negative at the beginning of the charging current pulse, then becomes positive. Consequently, the data transmitted by the computer 5 passes firstly through the output 6, this making it possible to record the maximum absolute value of $U_M - U_i$, and passes secondly through the output 8; the voltages supplied by the memory 7 and the output 8 are then added in the block 9, then this sum is compared with a threshold $U_O$ in the comparator 19 which sends out an output signal if this sum is higher than the predetermined threshold.

Point measurements can also be made of the transient voltages:

A first instant at the beginning of the charge current pulse, after approximately one second and a second instant in substantially the middle part of the said pulse.

Indeed, the two measurements indicate by the sign of the differences $U_M - U_i$ which case of the FIGS. 1 to 4 is concerned. The battery is then rejected in any of the following cases:

When the two measured differences are positive, the difference resulting from the second measurement becomes higher than a predetermined threshold;

When the two measured differences are negative, the absolute value of the difference resulting from the first measurement becomes higher than a predetermined threshold;

When the differences $U_M - U_i$ have opposite signs, the sum of the absolute values of the said differences becomes higher than a predetermined threshold.

In the case where the intermediate electric connections 20 to 24 of the cells 10 to 15 are not externally accessible, the method according to the invention can be implemented by means of the device shown schematically in FIG. 6.

Reference electrodes 30 to 35 (which are, for example, mercury-mercurous sulphate electrodes) are inserted in the filling orifices of the cells. Each voltage $U_2$ to $U_6$ measured between two consecutive ones of the reference electrodes corresponds to the potential difference existing between the positive plates of a first cell and the negative plates of a second (or vice versa). The voltage $U_1$ defined previously is equal, here, to $U_1^+ + U_1^-$, $U_1^+$ being the voltage measured between the positive terminal 3 of the battery and the electrode 30, $U_1^-$ being the voltage measured between the electrode 35 and the negative terminal 2.

The voltage signal processing elements coming from the computer 5 are analogous to those which appear in FIG. 5; the operation of the elements in FIG. 6 is also analogous and the explanations with reference to FIG. 1 to 4 concerning the device described in FIG. 5 remain applicable.

Only a single type of curve corresponding to a charge current pulse having an intensity proportional to time (FIG. 1) has been shown; indeed, the curves showing a difference $U_M - U_i$ which is negative or changes sign (FIGS. 3 and 4) correspond to a square wave pulse. With a pulse having an intensity proportional to time, the curves showing a difference $U_M - U_i$ which is negative or changes sign would have a graph close to those in FIGS. 3 and 4 and the description given above for a square wave pulse remains applicable.

Moreover, a same threshold $U_O$ can be chosen for the three types of differences $U_M - U_i$ (always positive, always negative, changing sign) or thresholds particular to at least one type of difference can be chosen; different thresholds according to the type of charge pulse used can also be chosen.

It must be understood that the invention is in no way limited to the embodiments described and illustrated, which have been given only by way of example. More particularly, without going beyond the scope of the invention, certain arrangements can be changed or certain means can be replaced by equivalent means.

What we claim is:

1. A method of checking a storage battery with series-connected cells comprising the following steps:

passing a charging current pulse through the battery;
measuring elementary transient voltages at the terminals of each storage cell; and measuring a total transient voltage and dividing the total voltage by the number of storage cells to obtain an average transient voltage,
comparing the elementary transient voltages with the average transient voltage of said storage cells; and
providing a battery reject signal as a result of said comparing if the absolute value of the difference between said transient voltage and one of the elementary transient voltages, becomes higher than a predetermined threshold.

2. The method according to claim 1, wherein said elementary transient voltage measuring step comprises taking point measurements of the transient voltages at a first instant at the beginning of the charge current pulse, after approximately one second and at a second instant in substantially the middle part of said pulse.

3. The method according to claim 2, wherein the battery reject signal is provided if the difference resulting from the second embodiment is greater than a predetermined threshold when the differences resulting from the first and from the second measurement are positive.

4. The method according to claim 2, wherein the battery reject signal is provided if the absolute value of the difference resulting from the first measurement is greater than a predetermined threshold when the differences resulting from the first and from the second measurement are negative.

5. The method according to claim 2, wherein the battery reject signal is provided if the sum of the absolute values of said differences is greater than a predetermined threshold when the differences resulting from the first and from the second measurement have opposite signs.

6. The method according to claim 1, wherein the step of passing a charge current pulse comprises passing a charge current square wave pulse whose intensity is a few amperes and which last a few seconds.

7. The method according to claim 1, wherein the step of passing a charge current pulse comprises passing a current charge pulse which has an intensity which increases in proportion to time and is in the order of a few amperes.

8. A device for checking a storage battery with series connected cells, said device comprising:
means for passing a charging current pulse through the battery,
means for measuring elementary transient voltages at the terminals of each storage cell, and means for measuring a total transient voltage and dividing the total voltage by the number of storage cells to obtain an average transient voltage,
means for comparing the elementary transient voltages with the average transient voltage of the storage cells and for providing a battery reject signal as a result of said comparing if the absolute value of the difference between said average transient voltage and one of the elementary transient voltages, becomes higher than a predetermined threshold.

* * * * *